(12) United States Patent
Wong

(10) Patent No.: US 6,284,091 B1
(45) Date of Patent: Sep. 4, 2001

(54) UNIQUE CHEMICAL MECHANICAL PLANARIZATION APPROACH WHICH UTILIZES MAGNETIC SLURRY FOR POLISH AND MAGNETIC FIELDS FOR PROCESS CONTROL

(75) Inventor: Lawrence D. Wong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/352,634

(22) Filed: Jul. 13, 1999

Related U.S. Application Data

(62) Division of application No. 09/001,509, filed on Dec. 31, 1997, now Pat. No. 6,083,839.

(51) Int. Cl.$^7$ ........................................................ C23F 1/02
(52) U.S. Cl. ............................................................ 156/345
(58) Field of Search .................................. 438/691, 692, 438/693; 451/7, 41, 35, 36; 156/345

(56) References Cited

U.S. PATENT DOCUMENTS

| | | | |
|---|---|---|---|
| 5,264,010 | * 11/1993 | Brancaleoni et al. | 51/308 |
| 5,449,313 | * 9/1995 | Kordonsky et al. | 451/35 |
| 5,607,341 | * 3/1997 | Leach | 451/41 |
| 5,664,986 | * 9/1997 | Roh | 451/7 |
| 5,750,440 | 5/1998 | Vanell et al. . | |
| 5,865,891 | 2/1999 | Linliu . | |
| 6,022,807 | * 2/2000 | Lindsey et al. | 438/693 |

* cited by examiner

Primary Examiner—Benjamin L. Utech
Assistant Examiner—Duy-Vu Deo
(74) Attorney, Agent, or Firm—Blakely, Sokoloff, Taylor & Zafman LLP

(57) ABSTRACT

The present invention is an improved apparatus and process for chemical mechanical polishing (CMP) layers which have a low dielectric constant (k). The present invention uses a magnetic slurry and a magnetic coil for polishing the wafer with the magnetic slurry. By using a magnetic slurry and a magnetic coil the force used during polishing can be controlled resulting greater control over the CMP process during the polishing of low k materials.

24 Claims, 4 Drawing Sheets

UNIQUE CHEMICAL MECHANICAL PLANARIZATION APPROACH WHICH UTILIZES MAGNETIC SLURRY FOR POLISH AND MAGNETIC FIELDS FOR PROCESS CONTROL

This is a division of application Ser. No. 09/001,509, filed Dec. 31, 1997, now U.S. Pat. No. 6,083,839.

BACKGROUND OF THE INVENTION

1. Field of the Invention

This invention relates to the field of semiconductor devices, and more specifically, to a process and apparatus for chemical mechanical polishing.

2. Background Information

Integrated circuits manufactured today are made up of literally millions of active devices such as transistors and capacitors formed in a semiconductor substrate. These active devices are formed and interconnected in an elaborate system of layers. A considerable amount of effort in the manufacture of modern complex, high density multilevel interconnections is devoted to the planarization of the individual layers of the interconnect structure. Nonplanar surfaces create poor optical resolution of subsequent photolithographic processing steps. Poor optical resolution prohibits the printing of high density interconnect metal lines. Another problem with nonplanar surface topography is the step coverage of subsequent metallization layers. If a step height is too large there is a serious danger that open circuits will be created. Planar interconnect surface layers are a must in the fabrication of modern high density integrated circuits.

To ensure planar topography, various planarization techniques have been developed. One approach, known as chemical mechanical polishing, employs polishing to remove protruding steps formed along the upper surface of interlayer dielectrics (ILDs). Chemical mechanical polishing is also used to "etch back" conformally deposited metal layers to form planar plugs or vias.

FIG. 1 illustrates a typical chemical mechanical polisher 100. As shown, a substrate (or wafer) 110 is held by a carrier 120. Carrier 120 presses wafer 110 against polishing pad 130 with a downward force. Polishing pad 130 is attached to polishing platen 140. Polishing pad 130 is covered with an active slurry 150 and polishing platen 140 rotates in one direction while carrier 120 rotates in the opposite direction. The downward force, rotational motion, surface of the polishing pad, and slurry act together to polish or planarize the surface of wafer 110.

This type of chemical mechanical polishing however exhibits some problems. For example, such tools have limitations in controlling both components of shear force and downward force applied to a wafer surface. Moreover, as semiconductor devices become smaller and more dense chemical mechanical polishing is causing some problems with newer materials used to fabricate current semiconductor devices. Prior art materials used in conjunction with chemical mechanical polishing have been relatively hard and/or stiff materials such as oxides, polysilicon, etc. As a result, chemical mechanical polishing processes have been optimized for these materials.

New materials, such as materials with low dielectric constants are being used in order to reduce the RC Time Constant in current semiconductor devices. The RC Time Constant is the fundamental limit of a microprocessor caused by the capacitance between the metal lines of the microprocessor. There are two things which determine the RC Time Constant: the resistance of the metal lines themselves and the capacitance of the dielectric materials.

Silicon dioxide, which is widely used as a dielectric material has a dielectric constant (k) of approximately k=4. However, by switching to materials with lower dielectric constants, for example in the range of approximately k=2–3, several advantages may be obtained. The use of low k polymers have been found reduce the RC Time Constant due to a decreased capacitance and therefore increase the speed of the device. The use of low k materials have also been found to reduce power consumption, and reduce crosstalk noise between metal lines.

Unfortunately, low k materials tend to be polymers which are more plastic like materials. Therefore, when polishing such low k materials in chemical mechanical polishing they tend to bend and/or deform, because they are plastic, causing bad results and bad uniformity during planarization. This is especially apparent when comparing the polishing results in areas with densely populated regions of the topography and lightly populated regions of the topography. In other words, where the topography is densely populated the low k materials are less likely to bend under the downward force of the polisher resulting in better polishing uniformity. Whereas, in areas of the topography that are more lightly populated the low k materials are more likely to deform under the downward force of the polisher causing nonuniform results in the polishing process.

FIG. 2 illustrates a low k material after planarization with prior art chemical mechanical polisher and polishing method. As shown, low k material 210 was deposited above metal lines 220 and substrate 200. Since low k material 210 is somewhat plastic it deformed during the chemical mechanical polishing process. As illustrated, because low k material 210 deformed more in the less populated areas of the topography during the polishing process and as a consequence the top surface is not uniform and is not evenly planarized.

Other process issues also arise during chemical mechanical polishing of low k materials. For example, low k materials may interact with the polishing pads and slurries of the chemical mechanical polishing process. As another example, low k materials are mechanically weak and may have poor adhesion (compared to silicon oxides) and therefore may not hold up or adhere to underlying layers through the chemical mechanical polishing process. Additionally, low k materials have a lower thermal stability which may be affected by the friction and higher temperatures of the chemical mechanical polishing process. At higher temperatures low k materials may suffer thermal deformation (and plasticity) due to material heat up.

Thus, what is needed is a chemical mechanical polisher and polishing process that will improve process control over the planarization of low k materials with polishing uniformity and good electrical results regardless of the density of the underlying topography.

SUMMARY OF THE INVENTION

The present invention is an improved method and apparatus for polishing. The apparatus includes a wafer holder, a magnetic slurry, and a magnetic coil.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

Figure 1:
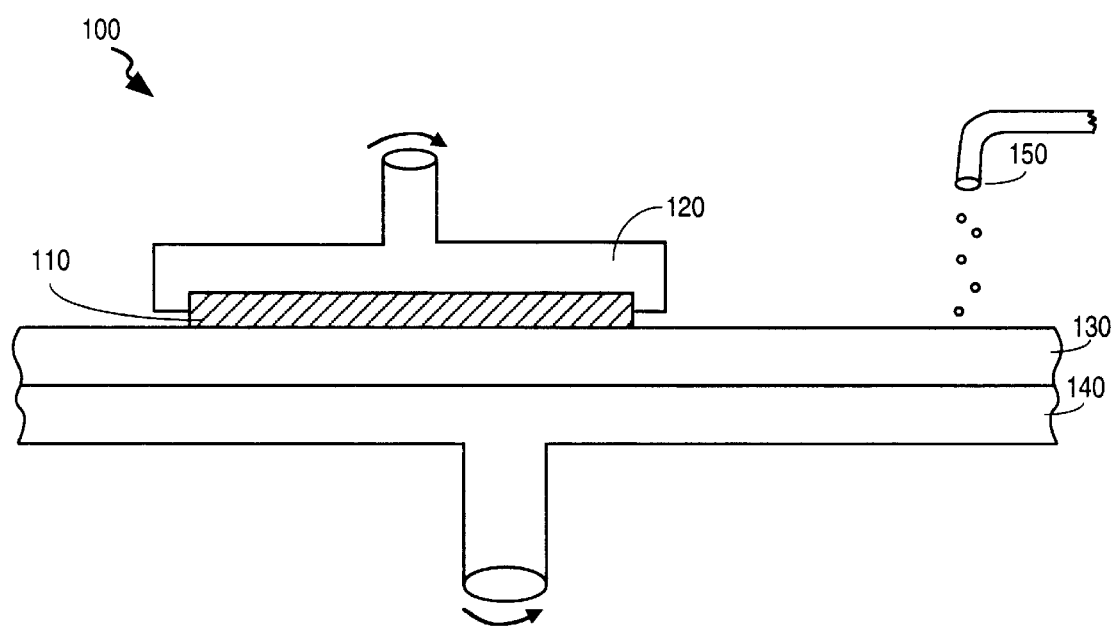
FIG. 1 illustrates a typical chemical mechanical polisher used in the prior art.
Figure 2:
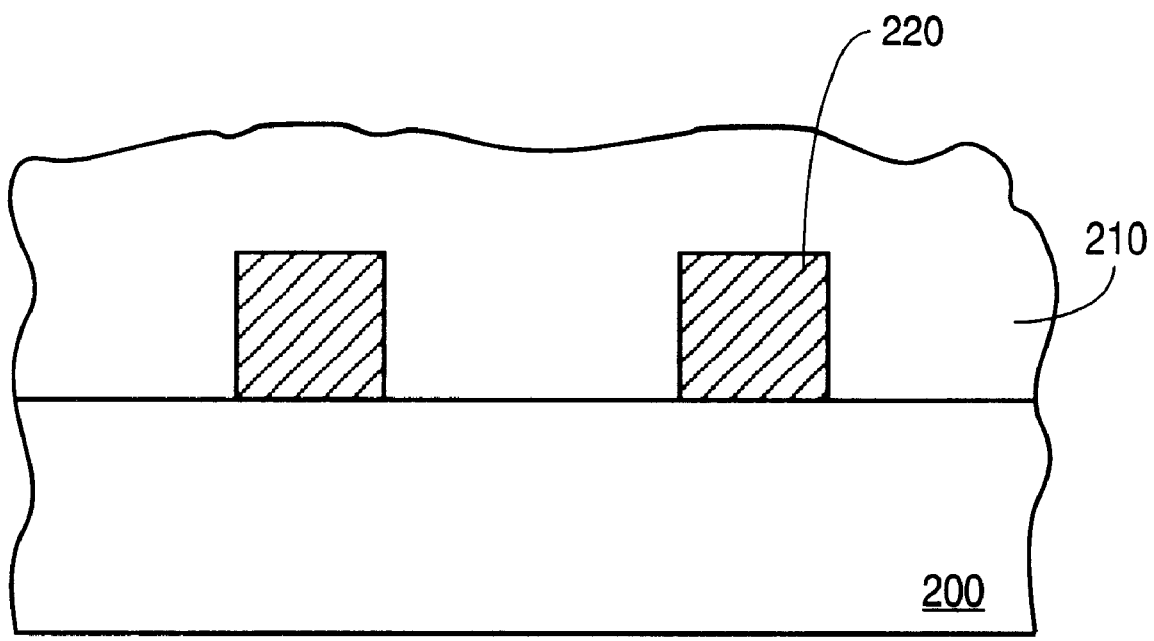
FIG. 2 illustrates a low k material after planarization with prior art chemical mechanical polisher and polishing method.

A Unique Chemical Mechanical Planarization Approach which Utilizes Magnetic Slurry for Polish and Magnetic Fields for Process Control is disclosed. In the following description, numerous specific details are set forth such as specific materials, process parameters, equipment, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention is an improved apparatus and process for chemical mechanical polishing (CMP) layers which have a low dielectric constant (k). The present invention uses a magnetic slurry and a magnetic coil for polishing the wafer with the magnetic slurry. By using a magnetic slurry and a magnetic coil the force used during polishing can be controlled resulting in greater control over the CMP process during the polishing of low k materials.

It should be noted that, the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing portions of an integrated circuit during fabrication are not drawn to scale, but instead are drawn so as to illustrate the important features of the invention.

It should also be noted that, the terms wafer and substrate are being used herein interchangeably. Also, that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, or substrates for processing other apparati and devices such as flat panel displays, multichip modules, etc.

As stated in the background of the invention, low k dielectric materials, such as polymers, are being used in order to reduce the RC time constant, reduce power consumption, and reduce metal line cross talk in order to improve the performance of semiconductor devices. Such low k materials however deform/bend, interact with polishing pads and slurries, and exhibit poor adhesive qualities in prior art chemical mechanical polishing (CMP) processes and apparati. Some examples of low k materials are polyaromatic ethers (PAEs), aerogels, xerogels, parylene, and amorphous fluorocarbons.

In order to improve planarization uniformity and process control of low k materials, the present invention changes the forces used during the CMP process. By changing the forces from mechanically applied downward compressive force to a magnetically controlled force and slurry, the present invention improves the distribution of the slurry and polishing results regardless of the density of the population of the topography.

Figure 3:
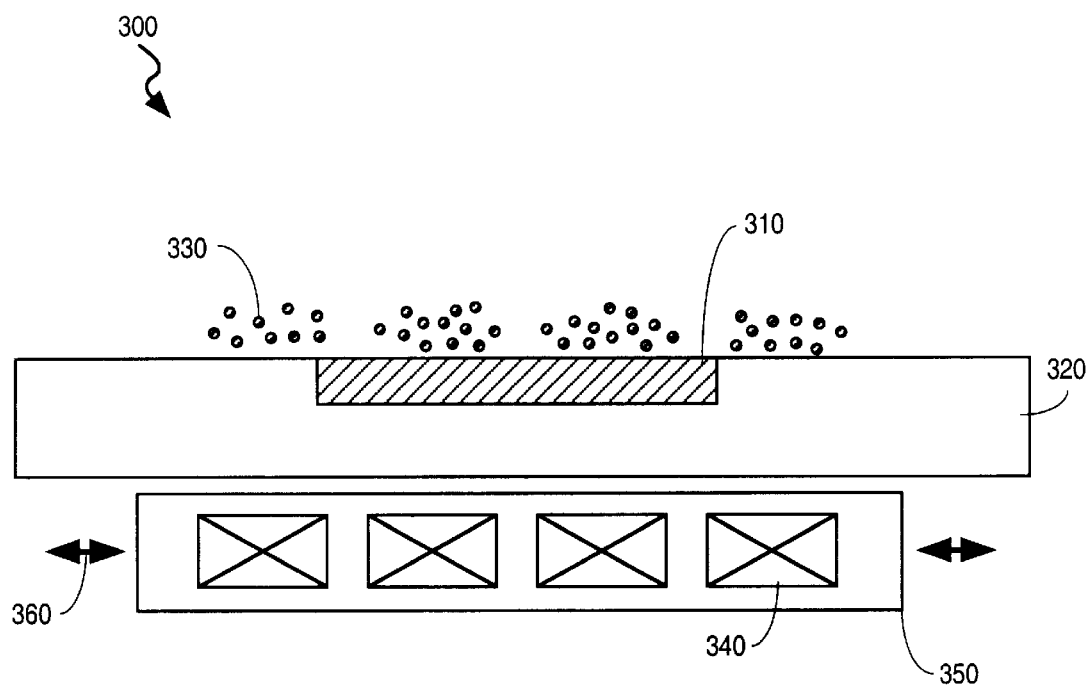
FIG. 3 illustrates a chemical mechanical polisher of the present invention.

FIG. 3 illustrates a chemical mechanical polisher 300 as used in an embodiment of the present invention. As shown, a substrate (or wafer) 310 is held by a wafer holder 320. In one embodiment of the present invention wafer holder 320 is an electrostatic chuck. It should be noted that the wafer 310 may be recessed in the wafer holder 320 for optimal delivery of the slurry however, other embodiments may hold the wafer on top of wafer holder 320.

As illustrated, above the wafer is a magnetic slurry 330. The magnetic slurry 330 may be a silica or cerium based slurry, for example silica oxide and cerium oxide, having a ferromagnetic material therein. It should be noted that the chemical portion of the slurry is the silica or cerium base while the portion of the magnetic slurry that imparts the physical motion is the ferromagnetic material. It should also be noted that the magnetic slurry 330 may be a wet or dry polishing slurry.

Chemical mechanical polisher 300, as shown, also has a movable stage 350 which includes magnetic coils 340. Movable stage 350 and magnetic coils 340 are used to impart motion to magnetic slurry 330 for the polishing process. The strength of magnetic coils 340 are to be sized such that the optimal polishing parameters may be obtained. For example stronger magnetic coils increase the force of the magnetic slurry on the wafer surface. Stronger magnetic coils may also be used to increase the polishing rate. The field strength of magnetic coils 340 may range from approximately 100–1,000 Gauss. In one embodiment of the present invention the magnetic coils 340 have a field strength in the range of approximately 800–900 Gauss.

It should be noted that the field strength of the magnetic coils may vary within the movable stage 350. For example, the first magnetic coil may have a field strength of approximately 500 Gauss, while the second magnetic coil may have a field strength of approximately 800 Gauss, the third magnetic coil may have a field strength of approximately 700 Gauss, etc. It should also be noted that there may be any number of magnetic coils in the movable stage and the number of magnetic coils will depend upon the particular user.

Movable stage 350 imparts the motion to the magnetic slurry 330. Movable stage 350 may be moved in an any desired direction in order to move the slurry to desired locations or perform a particular polish pattern. Movable stage may be moved in an x-y directional plane (360) as well as in a circular motion (not shown). Movable stage may also be moved up and down, or closer to and further from (not shown) the wafer holder 320 in order to vary the strength of the magnetic coils on the magnetic slurry. In other words, the closer the movable stage 350 is to the wafer holder 320, the greater the strength of the magnetic coils 340 and the greater the force exhibited on the magnetic slurry 330. Also, the further the movable stage 350 is from the wafer holder 320, the lesser the strength of the magnetic coils 340 and the lesser the force exhibited on the magnetic slurry 330.

Imparting motion to magnetic slurry using movable stage 350 and controlling the downward force of the magnetic slurry by changing the field strength and positioning of the magnetic coils allows greater process control over the CMP process especially in the polishing and/or planarization of low k materials. It should be noted that field modelling would be advantageous in order to determine the best conditions for field uniformity and strength of the magnetic coils.

Figure 4:
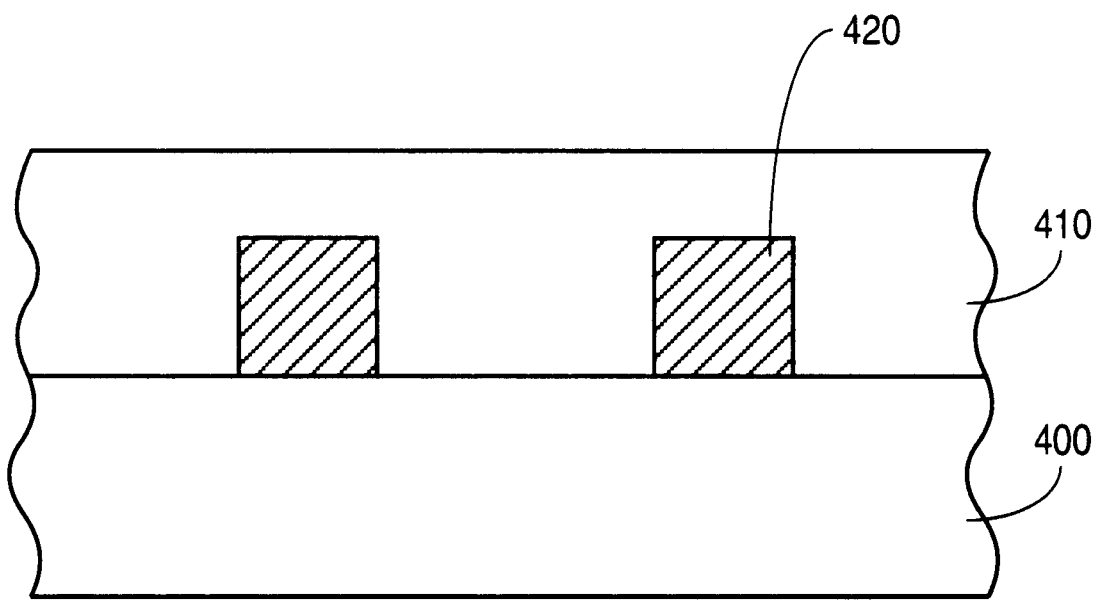
FIG. 4 illustrates a low k material after planarization with the chemical mechanical polishing apparatus and process of the present invention.

FIG. 4 illustrates a low k material after planarization with the chemical mechanical polishing apparatus and process of the present invention. As shown, low k material 410 was deposited above metal lines 420 and substrate 400. Since, with the use of the present invention, the downward force and slurry distribution has greater control, the polished low k material 410 is more uniform and does not exhibit as much deformity during CMP. Therefore, as illustrated, with the use of the present invention the top surface of the low k material 410 is uniform and is more evenly planarized regardless of the underlying topography.

It should be noted that since the present invention does not use a polishing pad there is no concern with the interaction between the low k material and a polishing pad material. It should also be noted that because of the greater control of the downward and shear force with the present invention the low k material will not be ripped or tugged at and therefore the weakness and poor adhesive qualities of the low k material are also not as great a concern.

Additionally, the only friction in the present invention is between the slurry and the wafer being polished. Therefore, there is no longer the friction component from the polishing pad against the wafer as in the prior art. As stated in the background section the friction of the polishing pad and wafer tended to heat up the CMP process and caused problems because of the low k materials have a lower thermal stability or deformation temperature. Because such friction no longer exists in the present invention the temperature of the CMP process will remain relatively steady and the lower thermal stability of the low k materials is not as great a concern.

Thus, a Unique Chemical Mechanical Planarization Approach which Utilizes Magnetic Slurry for Polish and Magnetic Fields for Process Control has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. An apparatus comprising:
    a substrate holder;
    a substrate disposed on top of said substrate holder;
    a magnetic slurry disposed on top of said substrate; and
    a stage disposed below said substrate holder, said stage comprising a magnetic coil.

2. The apparatus of claim 1 wherein said substrate is a wafer.

3. The apparatus of claim 2 wherein said substrate holder is a wafer holder.

4. The apparatus of claim 3 wherein said wafer holder is an electrostatic chuck.

5. The apparatus of claim 3 wherein said wafer is recessed in said wafer holder.

6. The apparatus of claim 1 wherein said magnetic slurry comprises a ferromagnetic material.

7. The apparatus of claim 6 wherein said magnetic slurry further comprises siilica oxide.

8. The apparatus of claim 6 wherein said magnetic slurry further comprises cerium oxide.

9. The apparatus of claim 1 wherein said magnetic slurry comprises a wet polishing slurry.

10. The apparatus of claim 1 wherein said magnetic slurry comprises a dry polishing slurry.

11. The apparatus of claim 1 wherein said strength can increase a force of said magnetic slurry on said substrate.

12. The apparatus of claim 1 wherein said strength can increase a polishing rate of said substrate.

13. The apparatus of claim 1 wherein said magnetic coil has a field strength that may range from approximately 100–1000 Gauss.

14. The apparatus of claim 1 wherein said magnetic coil has a field strength in a range of approximately 800–900 Gauss.

15. The apparatus of claim 1 wherein said magnetic coil may have a field strength that may vary within said stage.

16. The apparatus of claim 1 wherein said stage may be moved in any desired direction in order to move said magnetic slurry to desired locations.

17. The apparatus of claim 1 wherein said stage may be moved in any desired direction in order to perform a particular polish pattern.

18. The apparatus of claim 1 wherein said stage may be moved in an x-y directional plane as well as in a circular motion.

19. The apparatus of claim 1 wherein said stage may be moved closer to or further from said substrate holder in order to vary said strength of said magnetic coil on said magnetic slurry.

20. The apparatus of claim 1 wherein said apparatus does not comprise a polishing pad.

21. An apparatus comprising:
    a wafer holder, said wafer holder having a first side and a second side;
    a magnetic slurry disposed adjacent to said first side of said wafer holder; and
    a stage disposed adjacent to said second side of said wafer holder, said stage comprising a magnetic coil.

22. The apparatus of claim 21 wherein said magnetic coil has a strength that is sized to obtain optimal polishing parameters.

23. The apparatus of claim 21 wherein said stage may be moved in any desired direction in order to perform a particular polish pattern.

24. The apparatus of claim 22 wherein said stage may be moved closer to or further from said wafer holder in order to vary said strength of said magnetic coil on said magnetic slurry.

\* \* \* \* \*